United States Patent [19]

Hasegawa

[11] Patent Number: 5,368,973
[45] Date of Patent: Nov. 29, 1994

[54] LIGHT-SENSITIVE ELEMENT AND PROCESS FOR PREPARATION THEREOF

[75] Inventor: Akira Hasegawa, Shizuoka, Japan

[73] Assignee: Fuji Photo Film Co., Ltd., Minami-Ashigara, Japan

[21] Appl. No.: 784,992

[22] Filed: Oct. 30, 1991

[30] Foreign Application Priority Data

Oct. 31, 1990 [JP] Japan .................. 2-294728

[51] Int. Cl.⁵ .............................. G03C 1/74
[52] U.S. Cl. ...................... 430/138; 430/302
[58] Field of Search ............... 430/138, 202, 253, 302; 428/402.21, 402.22

[56] References Cited

U.S. PATENT DOCUMENTS

| | | | |
|---|---|---|---|
| 4,189,323 | 2/1980 | Buhr . | |
| 4,529,681 | 7/1985 | Usami et al. | 430/138 |
| 4,636,453 | 1/1987 | Keys et al. | 430/138 |
| 4,687,725 | 8/1987 | Wright et al. . | |
| 4,772,530 | 9/1988 | Gottschalk et al. | 430/281 |
| 4,772,534 | 9/1988 | Kawamura et al. . | |
| 4,772,541 | 9/1988 | Gottschalk et al. . | |
| 4,800,148 | 1/1989 | Harada et al. | 430/138 |
| 4,803,148 | 2/1989 | Harada et al. | 430/138 |
| 4,837,128 | 6/1989 | Kawamma et al. . | |
| 4,842,976 | 7/1989 | Sanders et al. | 430/138 |
| 4,912,011 | 3/1990 | Yamamoto et al. | 430/138 |
| 4,937,161 | 6/1990 | Kita et al. . | |
| 4,938,900 | 7/1990 | Mokiwzki | 428/402.21 |
| 4,942,107 | 7/1990 | Saeki et al. | 430/138 |
| 4,950,581 | 8/1990 | Koike et al. . | |
| 4,963,458 | 10/1990 | Ishikawa et al. | 430/138 |
| 4,999,273 | 3/1991 | Hasegawa . | |
| 5,051,333 | 9/1991 | Yanagihara et al. | 430/138 |

FOREIGN PATENT DOCUMENTS

| | | |
|---|---|---|
| 0242864 | 10/1987 | European Pat. Off. . |
| 0243863 | 11/1987 | European Pat. Off. . |
| 0284378 | 9/1988 | European Pat. Off. . |
| 42-446 | of 0000 | Japan . |
| 42-771 | of 0000 | Japan . |
| 36-9168 | of 0000 | Japan . |
| 42-14344 | of 0000 | Japan . |
| 38-19574 | of 0000 | Japan . |
| 61-135793 | of 0000 | Japan . |
| 58-224572 | of 0000 | Japan . |
| 48-28123 | 8/1973 | Japan . |
| 50-30615 | 3/1975 | Japan . |
| 50-44012 | 4/1975 | Japan . |
| 53-12739 | 2/1978 | Japan . |
| 57-124343 | 8/1982 | Japan . |
| 57-179836 | 11/1982 | Japan . |
| 57-197538 | 12/1982 | Japan . |
| 59-2845 | 1/1984 | Japan . |
| 60-120354 | 6/1985 | Japan . |
| 61-3797 | 1/1986 | Japan . |
| 61-73145 | 4/1986 | Japan . |
| 62-187346 | 8/1987 | Japan . |
| 62-209436 | 9/1987 | Japan . |
| 1-298348 | 12/1989 | Japan . |
| 930422 | 7/1963 | United Kingdom . |
| 950443 | 2/1964 | United Kingdom . |
| 952807 | 3/1964 | United Kingdom . |
| 965074 | 7/1964 | United Kingdom . |
| 1232347 | 5/1971 | United Kingdom . |
| 1412768 | 11/1975 | United Kingdom . |

*Primary Examiner*—Christopher D. Rodee
*Attorney, Agent, or Firm*—Burns, Doane, Swecker & Mathis

[57] ABSTRACT

A light-sensitive element which comprises a substrate having provided thereon a light-sensitive layer which comprises microcapsules containing at least an ethylenically unsaturated compound and a photopolymerization initiator as active substances, wherein the active substances diffused from the microcapsules are present on and around the surface of the microcapsules.

The light-sensitive element, when imagewise exposed to light, forms a continuous strong film in exposed areas, and unexposed areas can be easily washed off with water to give a printing plate which produces prints having no background contamination.

3 Claims, No Drawings

LIGHT-SENSITIVE ELEMENT AND PROCESS FOR PREPARATION THEREOF

BACKGROUND OF THE INVENTION

The present invention relates to a novel light-sensitive element and a process for preparation thereof, and more specifically to a light-sensitive element by which images having high sensitivity and high resolution can be obtained with a simple treatment after imagewise exposure.

A light-sensitive element which comprises a photopolymerizable composition on a substrate is known in the field of imaging, resists, printing plate and the like. The photopolymerizable composition comprises an organic polymer binder, an ethylenically unsaturated compound, a photopolymerization initiator and additives which improve properties of the composition. Recently, microcapsulated light-sensitive compositions have been used in photopolymerizable elements, concerning which a number of patent applications are publicly disclosed. U.S. Pat. Nos. 4,399,209, 4,440,846, 4,416,966 and 4,501,809, Japanese unexamined patent publications (hereinafter referred to as J.P. KOKAI) No. Sho 59-30537, Sho 57-124343, Sho 57-179836, Sho 57-197538, Sho 59-91438 and Sho 61-275742, and Japanese examined patent publication (hereinafter referred to as J.P. KOKOKU) No. Sho 42-14344 are directed to imaging processes in which microcapsulated light-sensitive compositions are used. A light-sensitive element used in the imaging process is prepared by microcapsuling a liquid photopolymerizable composition and at least one of a color producing reagent and a developer which react with each other to produce a colored compound and then applying the resulting microcapsules on a substrate. When both of a color producing reagent and a developer are applied on a substrate, microcapsulation prevents contact of the color producing reagent with the developer by the walls of microcapsules so that the light-sensitive element keeps good storage stability. By pattern exposure, exposed areas are cured while unexposed areas are not cured. The microcapsules in the unexposed areas are destroyed by any energy so that the color producing reagent gets contact with the developer to produce a colored compound, which results in producing images.

U.S. Pat. Nos. 4,636,453, 4,687,725 and 4,916,041, J.P. KOKAI No. Sho 58-224752, Sho 59-2845, Sho 61-281242, Sho 61-135793 and Sho 62-250455 are directed to printing plates which comprise a microcapsulated light-sensitive composition. U.S. Pat. No. 4,636,453 discloses a photopolymerizable element which is prepared by encapsulating at least one active component having compatibility with other components of a photopolymerizable composition in pressure-destructable microcapsules having resistance to a solvent for the photopolymerizable composition, applying on a susbstrate the resulting microcapsules together with the other components of the photopolymerizable composition and applying a protective layer thereon. U.S. Pat. No. 4,636,453 is directed to a presensitized plate which keeps strorage stability by microcapsuling components of a photopolymerizable composition to isolate the components from each other. The plate is pressed under sufficient pressure to destroy substantially all of the microcapsules prior to use, then imagewise exposed to light and developed with a solvent which dissolves the photopolymerizable layer to remove the unexposed areas completely. U.S. Pat. No. 4,687,725 discloses a light-sensitive element which comprises microcapsules containing a photo-setting composition on an etchable layer. After the light-sensitive element is imagewise exposed to light, the microcapsules are destroyed to form an etching resistive layer with the photo-setting composition running off from the destroyed microcapsules in the unexposed areas. In subsequent etching, an etching solution can soak easily through the microcapsule layer in the exposed areas to etch the underlying layer because the microcapsule layer in the exposed areas is porous, which results in formation of a pattern. U.S. Pat. No. 4,916,041 discloses a printing plate which can be obtained by imagewise exposing to light a presensitized plate which comprises a hydrophilic substrate and a highly light-sensitive layer applied thereon which comprises a hydrophilic binder and hydrophobic microcapsules comprising silver halide, a reducing agent and ethylenically unsaturated compound, destroying the unexposed microcapsules to run off the composition therein, photo-setting the runned-off composition and washing off the exposed microcapsules. J.P. KOKAI No. Sho 58-224752 discloses a printing plate which can be obtained by imagewise exposing to light a light-sensitive layer which comprises hydrophilic microcapsules containing a photo-setting resin applied on a water-resistant substrate, destroying the unexposed microcapsules to run off the composition therein and photo-setting the runned-off composition. J.P. KOKAI No. Sho 61-281242 discloses a process for preparing a printing plate comprising the steps of imagewise exposing to light a light-sensitive element comprising a substrate having provided thereon microcapsules containing photopolymerizable monomers, laying the light-sensitive element on the top of a hydrophilic substrate to press together, transferring the photopolymerizable monomers in the microcapsules in the unexposed areas to the hydrophilic substrate and exposing the substrate to light over the whole surface thereof. J.P. KOKAI No. Sho 62-250455 discloses a printing plate which can be obtained by imagewise exposing to light a light-sensitive element comprising a hydrophilic substrate having provided thereon a light sensitive layer containing a hydrophilic binder and microcapsules comprising photopolymerizable monomers and a hydrophobic wall membrane, destroying the unexposed microcapsules by heating to run off the composition therein, photo-setting the runned-off composition and subsequently removing the exposed areas of the light-sensitive layer.

From the above, it is necessary in the prior art to incorporate a light-sensitive composition in a microcapsule and to destroy the microcapsule prior to or after imagewise exposure to exhibit the function of the composition.

Since the above mentioned photopolymerizable elements which comprise microcapsules need the steps of destroying the microcapsules, transferring the composition in the microcapsules to another substrate, post exposing the resulting substrate and the like, such complicated steps increase the cost for the treatment.

Further, U.S. Pat. No. 4,636,453 discloses use of a solvent to remove the uncured areas after exposure to light, which is not preferred in view of preservation of the environment and health.

SUMMARY OF THE INVENTION

Accordingly, an object of the present invention is to provide a light-sensitive element which does not need the step of destroying microcapsules in use.

Another object of the present invention is to provide a light-sensitive element in which the uncured areas can be washed off with water-based solution.

Further object of the present invention is to provide a light-sensitive element which can be applied for printing immediately after the element is imagewise exposed to light and set on an offset printing machine without any further treatment for the exposed element, and whose light-sensitive layer in the unexposed areas can be removed on the printing machine.

Also, another object of the present invention is to provide a process for preparing the above light-sensitive element.

The aforementioned objects of the present invention can effectively be accomplished by providing a light-sensitive element which comprises a substrate having provided thereon a light-sensitive layer which comprises microcapsules containing at least an ethylenically unsaturated compound and a photopolymerization initiator as active substances, wherein the active substances diffused from the microcapsules are present on and around the surface of the microcapsules.

DETAILED EXPLANATION OF THE INVENTION

The present invention will hereunder be described in more detail.

The preferred microcapsule wall used in the present invention has three-dimensional cross-linking and solvent-swelling property. From this point of view, examples of the preferred microcapsule wall materials include polyurea, polyurethane, polyester, polycarbonate, polyamide and a mixture thereof, and particularly polyurea and polyurethane are preferred.

The condition under which the ethylenically unsaturated compound and the photopolymerization initiator diffused from the microcapsules are present on and around the surface of the microcapsules in the light-sensitive layer, which is required in the present invention, can be obtained by providing a dispersion of microcapsules containing at least an ethylenically unsaturated compound and a photopolymerization initiator, adding to the dispersion a solvent which is soluble in the dispersion, swells the microcapsule walls and dissolves the ethylenically unsaturated compound and the photopolymerization initiator, coating the resulting dispersion on a substrate and drying the coated substrate.

The solvent is selected from a number of commercially available solvents depending on a solvent for dispersion of microcapsules, a material for the microcapsule wall, the thickness of the wall and kinds of the ethylenically unsaturated compound and the photopolymerization initiator and the like. For example, for water-dispersible microcapsules which comprise cross-linked polyurea or polyurethane walls and contain a hydrophobic ethylenically unsaturated compound, such solvents are preferred as alcohols, ethers, acetals, esters, ketones, polyalcohols, amides, amines and fatty acids.

Illustrative examples of the above solvents include methanol, ethanol, tertiary butanol, n-propanol, tetrahydrofuran, 1,4-dioxan, ethyl butyrate, methyethylketone, propylene glycol monomethyl ether, ethylene glycol diethyl ether, ethylene glycol monomethyl ether, propylene chlorhydrin, propylene glycol monoethyl ether, ethylene glycol isopropyl ether, diethylene glycol methyl ethyl ether, ethylene glycol monomethyl ether acetate, 2-methoxyethyl acetate, N,N-dimethylformamide, butylamine, n-amylamine, formic acid, acetic acid, propionic acid and the like. A mixture of at least two of the above solvents can also be used.

Solvents which are not soluble in the dispersion of the microcapsules but become soluble by being mixed with the above mentioned solvent can also be used.

The amount of the solvent depends on combination of the materials. If the amount is less than a suitable one, image forming is insufficient. If the amount is more than a suitable one, stability of the dispersion is decreased and the materials incorporated in the microcapsules diffuse too much so that the film forming property after drying is too deteriorated to be practical for use. Generally, the solvent is effectively used in an amount of from 5 to 95% by weight based on the total weight of the light-sensitive solution, preferably in an amount of from 10 to 90% by weight, and more preferably in an amount of from 15 to 85% by weight.

The active substances which are present on and around the surface of the microcapsules can be measured by a conventional surface measurement technique using X-ray photoelectron spectroscopy (ESCA).

The microcapsules used in the present invention can be prepared by any processes known in this field. Examples of the processes include processes disclosed in U.S. Pat. Nos. 2,800,457 and 2,800,458 which use coacervation of hydrophilic wall materials, interfacial polymerization processes disclosed in U.S. Pat. No. 3,287,154, British Patent No. 950,443 and J.P. KOKOKU Nos. Sho 38-19574, Sho 42-446 and Sho 42-771, processes using deposit of polymers disclosed in U.S. Pat. Nos. 3,418,250 and 3,660,304, a process using an isocyanate polyol wall material disclosed in U.S. Pat. No. 3,796,669, a process using an isocyanate wall material disclosed in U.S. Pat. No. 3,914,511, processes using urea-formaldehyde or ureaformaldehyderesorcinol wall forming materials disclosed in U.S. Pat. Nos. 4,001,140, 4,087,376 and 4,089,802, a process using wall forming materials such as melamine-formaldehyde resin and hydroxypropyl cellulose disclosed in U.S. Pat. No. 4,025,455, in-situ processes using polymerization of monomers disclosed in J.P. KOKOKU No. Sho 36-9168 and J.P. KOKAI No. Sho 51-9079, electrolysis dispersion cooling processes disclosed in British Patent Nos. 952,807 and 965,074 and a spray drying process disclosed in U.S. Pat. No. 3,111,407 and British Patent No. 930,422. Although the processes used in the present invention are not restricted to the above processes, it is preferred to use a process wherein a core material is emulsified and then cross-linked polymer membrane is formed as microcapsule walls.

It is preferred to control the particle size of the microcapsules to from 0.01 to 30$\mu$, especially from 0.01 to 10$\mu$ in view of handling properties, more especially from 0.01 to 5$\mu$ in view of pattern-resolution.

Examples of the ethylenically unsaturated compounds used in the light-sensitive element of the present invention include acrylic acid, its salts, acrylic esters, acrylamides, methacrylic acids, its salts, methacrylic esters, methacrylamides, maleic anhydride, maleic esters, itaconic esters, styrenes, vinyl ethers, vinyl esters, N-vinyl heterocylic compounds, allylethers, allyesters and derivatives thereof.

Illustrative examples of the acrylic esters include n-butyl acrylate, cyclohexyl acrylate, 2-ethylhexyl acrylate, benzyl acrylate, furfuryl acrylate, ethoxy ethoxy ethyl acrylate, dicyclohexyl oxyethyl acrylate, nonylphenyl oxyethyl acrylate, hexanediol diacrylate, butanediol diacrylate, neopentyl glycol diacrylate, dipentaerythritol pentaacrylate, dipentaerythritol hexaacrylate, trimetylolpropane triacrylate, pentaerythritol tetraacrylate, dipentaerythritol pentaacrylate, dipentaerythritol hexaacrylate, diacrylates of polyoxyethylenic bisphenol A, polyacrylates of hydroxypolyether, polyester acrylates, polyurethane acrylates and the like.

Illustrative examples of the methacrylate esters include methylmethacrylate, butylmethacrylate, ethylene glycol dimethacrylate, butanediol dimethacrylate, neopentyl glycol dimethacrylate, trimetylolpropane trimethacrylate, pentaerythritol trimethacrylate, pentaerythritol tetramethacrylate, dimethacrylates of polyoxyalkylenic bisphenol A and the like. The above mentioned ethylenically unsaturated compound may be used alone or in combination.

The amount of the ethylenically unsaturated compound may be from 20 to 95% by weight based on the total weight of the microcapsules, preferably from 25 to 90% by weight, more preferably from 30 to 85% by weight.

Examples of the preferred photopolymerization initiators include α-alkoxy phenyl ketones, polycyclic quinones, substituted and unsubstituted benzophenones, xanthones, thioxanthones, halogenated compounds such as chlorosulfonyl and chloromethyl aromatic compounds, chlorosulfonyl and chloromethyl heterocyclic compounds, chlorosulfonyl and chloromethyl benzophenones and fluorenones, hatoalkanes, α-halo-α-phenyl acetophenones, combinations of photoreducing dyes and reducing redoxes, halogenated paraffins such as brominated or chlorinated paraffin, benzoyl alkylethers, combinations of lophine dimer-mercapto compounds and the like.

Further, compounds disclosed in J.P.KOKAI Nos. Sho 53-133428, Sho 62-58241, Sho 62-143044, Sho 62-150242, Sho 63-153542 and Sho 64-13140 and Hei 1-138204 and Hei 1-298348 can be used.

Illustrative examples of the preferred photopolymerization initiators include 2,4-trichloromethyl(4'-methoxyphenyl)-6-triazine, 2,4-trichloromethyl(4'-methoxynaphtyl)-6-triazine, benzoylbutyl-2,2-dimethoxy-2-phenylacetophenone, 9,10-anthraquinone, benzophenone, 4-[p-N,N'-di(ethoxycarbonylmethyl)aminophenyl]-2,6-di(trichloromethyl)-S-triazine, Michler's ketone, 4,4'-diethylaminobenzophenone, xanthone, chloroxanthone, thioxanthone, chlorothioxanthone, 2,4-diethyl thioxanthone, chlorosulfonyl thioxanthone, chlorosulfonyl anthraquinone, chloromethylanthracene, chloromethyl benzothiazole, chlorosulfonyl benzoxazole, chloromethylquinoline, chloromethyl benzophenone, chlorosulfonyl benzophenone, fluorenone, carbon tetrabromide, benzoinbutylether, benzoinisopropylether, a combination of 2,2'-bis(O-chlorophenyl)-4,4',5,5'-tetraphenylbiimidazole and 2-mercapto-5-methylthio-1,3-4-thiadiazole and the like. The polymerization initiator may be used alone or in combination.

The photopolymerization initiator is preferably used in an amount of from 0.5 to 30% by weight based on the total weight of the ethylenically unsaturated compound, more preferbly in an amount of from 2 to 20% by weight.

When the polymerizable monomers and the photopolymerization initiator are encapsulated, a solvent can simultaneously be used. As such a solvent, a natural or synthetic oil can be used alone or in combination. Examples of the solvents include cottonseed oil, kerosine, aliphatic ketone, aliphatic ester, paraffin, naphthene oil, alkylated biphenyl, alkylated terphenyl, chlorinated paraffin, alkylated naphthalene and a diaryl ethane such as 1-phenyl-1-xylylethane, 1-phenyl-1-p-ethylphenyl ethane, dichloromethane, 1,1'-ditolylethane and the like.

A hydrophilic ethylenically unsaturated monomer is preferably added to the light-sensitive layer in order to improve image strength after imagewise exposure and remove easily the unexposed areas. The hydrophilic ethylenically unsaturated monomer may be used alone or in combination. The hydrophilic ethylenically unsaturated monomer may contain a moiety such as —(CH$_2$CH$_2$O)—, —(CH$_2$CH$_2$CH$_2$O)—, —(CHCH$_3$CH$_2$O)—, —OH, —COOH and the like in the molecule. Illustrative examples of the hydrophilic ethylenically unsaturated monomers include ethylene glycol dimethacrylate, diethylene glycol dimethacrylate, triethylene glycol dimethacrylate, tetraethylene glycol dimethacrylate, polyethylene glycol 600 dimethacrylate, polyethylene glycol 1000 dimethacrylate, polypropylene glycol 400 dimethacrylate, 2-hydroxy-1,3-dimethacryloxypropane, polyethylene glycol 200 diacrylate, polyethylene glycol 400 diacrylate, polyethylene glycol 600 diacrylate, 1,6-hexandiol diacrylate, tripropylene glycol diacrylate, polypropylene glycol 400 diacrylate, methoxydiethylene glycol methacrylate, methoxytetraethylene glycol methacrylate, methoxypolyethylene glycol 400 methacrylate, methoxypolyethylene glycol 1000 methacrylate, phenoxydiethylene glycol acrylate, phenoxypolyethylene glycol acetate, methoxytriethylene glycol acrylate, methoxypolyethylene glycol 400 acrylate, pentaerythritol triacrylate, phthalic monohydroxyethylacrylate, succinic monohydroxyethylacrylate, 2-hydroxy-3-phenoxypropylacrylate and the like.

The hydrophilic ethylenically unsaturated monomer is preferably used in the light-sensitive element of the present invention in an amount of from 0.1 to 20% by weight based on the total weight of the light-sensitive layer, more preferably in an amount of from 0.5 to 10% by weight.

In addition, a hydrophilic binder is preferably added to the light-sensitive layer in order to remove easily the unexposed areas.

The hydrophilic binder can be used alone or in combination. Typical hydrophilic binders are transparent or translucent hydrophilic binders which include natural materials including gelatin, derivatives thereof, derivatives of cellulose such as carboxymethylcellulose and methylcellulose and polysaccharides such as starch and gum arabic; and synthetic polymeric materials including water soluble polyvinyl compounds such as polyvinyl alcohol, polyvinyl pyrrolidone, acrylamide polymers, polyacrylic acid and vinyl acetate-acrylic acid copolymers.

The hydrophilic binder is preferably used in the light-sensitive element of the present invention in an amount of from 0.2 to 20% by weight based on the total weight of the light-sensitive layer, more preferably in an amount of from 0.5 to 10% by weight.

The substrate used in the present invention can be suitably selected from kown substrate materials. Illustrative examples of the substrates include paper;

sythetic paper; paper laminated with a plastic film such as polyethylene, polypropylene or polystyrene film; metal plates such as aluminum including alloys thereof, zinc, iron and copper plate; a film of plastics such as cellulose acetate, cellulose propionate, cellulose butyrate, polyethylene terephthalate, polyethylene, polystyrene, polypropylene, polycarbonate and polyvinyl acetal; and paper or a plastic film laminated or deposited with a layer of a metal such as those listed above. Among them, paper, synthetic paper, films of polyethylene terephthalate, polycarbonate and aluminum are preferred. The paper substrate is disclosed in J.P.KOKAI Nos. Sho 61-3797 and Sho 61-112150. The above substrate is optionally subjected to a surface roughening treatment, that is, graining or a surface treatment such as a hydrophilization treatment.

The substrate material is selected depending on use of the light-sensitive element. For preparation of a lithographic printing plate, an aluminum substrate is preferred.

Embodiments using an aluminun plate as a substrate will be described in detail hereinafter.

The surface treatment, that is, graining is conducted by for example, an electrochemical graining method where an aluminum plate is grained by electrifying it in a hydrochloric acid or nitric acid electrolyte; or a mechanical graining method such as a wire brush graining method where an aluminum surface is scraped with a metal wire, a ball graining method where an aluminum surface is grained with an abrasive ball and an abrasive, and a brush graining method where an aluminun surface is grained with a nylon brush and an abrasive, alone or in combination.

The thus grained aluminum plate is then chemically etched with an acid or alkali. An industrially useful method is an etching with an alkali.

Examples of the alkali agents preferably used for these purposes include sodium carbonate, sodium aluminate, sodium metasilicate, sodium phosphate, sodium hydroxide, potassium hydroxide, lithium hydroxide and the like. Preferred ranges of concentration of the alkali agent and temperature of etching are respectively from 1 to 50% by weight and from 20° to 100° C., and condition where the solubility of aluminum in the alkali is from 5 to 20 g/m$^2$ is preferable.

Further, acid washing is generally conducted after the alkali etching in order to remove smuts which remain on the surface of the aluminum plate. Example of the preferred acids includes nitric acid, sulfuric acid, phosphoric acid, chromic acid, hydrofluoric acid, borofluoric acid and the like.

Removal of smuts formed by an electrochemical roughening treatment of an aluminum plate is carried out preferably according to a method where the plate is contacted with sulfuric acid at a temperature of from 50° to 90° C. and a concentration of from 15 to 65% by weight as disclosed in J.P. KOKAI No. Sho 53-12739 or a method disclosed in J.P. KOKOKU No. Sho 48-28123.

The thus surface treated aluminum substrate can be optionally subjected to a further treatment such as anodization and chemical treatment. The anodization can be carried out according to a known method which has been used in this field. Specifically, the method comprises the step of passing a direct or alternative current through the aluminum plate in an aqueous solution or solution of sulfuric acid, phosphoric acid, chromic acid, oxalic acid, sulfamic acid, benzenesulfonic acid or the like, alone or in combination to form a anodized film on the surface of the aluminum plate.

Anodization condition can not be determined wholesale as they variously vary depending on a kind of the electrolyte used. Generally, an electrolyte concentration of from 1 to 80% by weight, a solution temperature of from 5° to 70° C., a current density of from 0.5 to 60 amperes/dm$^2$, a voltage of from 1 to 100 V and an electrolysis time of from 10 to 100 seconds are suitable.

Among the above anodization methods, especially preferred are a method where anodization is conducted in sulfuric acid under a high current density, which is disclosed in British Patent No. 1,412,768 and a method where anodization is conducted using phosphoric acid as an electrolytic bath, which is disclosed in U.S. Pat. No. 3,511,661.

The anodized aluminum plate may further be treated according to a method of dipping it in an aqueous alkali metal silicate such as an aqueous solution of sodium silicate as disclosed in U.S. Pat. Nos. 2,714,066 and 3,181,461, or provided with an undercoating layer of a hydrophilic cellulose such as carboxymethylcellulose containing a water soluble metal salt such as zinc acetate as disclosed in U.S. Pat. No. 3,860,426.

Various embodiments of the light-sensitive elements of the present invention, optional other components which can be contained in the light-sensitive layer, optional assistant layers which can be applied to the light-sensitive element, and the like will be described in detail hereinafter.

The light-sensitive elememnt of the present invention comprises a light-sensitive layer which comprises microcapsules containing the ethylenically unsaturated compound and the photopolymerization initiator as active substances, wherein the active substances diffused from said microcapsules are present on and around the surface of said microcapsules. The microcapsules may contain optional components which can be contained in the light-sensitive layer.

Examples of the optional components which can be contained in the light-sensitive layer include color imaging substances, sensitizing dyes, various imaging promotors (such as oils, surfactants, chain tranfer agents, compounds which have ability of removing oxgen), thermal polymerization initiators, halation or irradiation inhibiting dyes, mat agents, smudge inhibitors, plasticizers, binders, photopolymerization initiators, polymerizable compounds, fillers, antifoamers and the like.

The color imaging substances used in the light-sensitive element of the present invention are not especially restricted. Various kinds of substances can be used as the substances. Image areas or non-image areas can be colored by incorporating the color imaging substance in the light-sensitive layer so that it is easy to distinguish the image areas from the non-image areas. Examples of the color imaging substances include colored substances such as pigments and dyes, colorless or light color substances which develop a color by external energy such as heat, pressure, light irradiation and the like, or by contact with the other component such as developers, that is, color producing reagents. The color imaging substances are disclosed in detail in J.P. KOKAI No. Sho 61-73145. A light-sensitive material which uses a dye or pigment as a color imaging substance is disclosed in J.P. KOKAI No. Sho 62-187346. A light-sensitive material using lyco dye is disclosed in J.P. KOKAI Nos. Sho 62-209436, Sho 62-288827 and Sho 62-288828.

These color imaging substances can be used in the light-sensitive element of the present invention.

In addition to the aforementioned compounds, the microcapsules used in the light-sensitive element of the present invention may contain a thermal polymerization inhibitor. Useful examples of the thermal polymerization inhibitors include hydroquinone, p-methoxyphenol, di-tert-butyl-p-cresol, pyrogallol, tert-butyl catechol, benzoquinone, 4,4'-thio-bis(3-methyl-6-tert-butylphenol), 2,2'-methylene-bis(4-methyl-6-tert-butylphenol), and 2-mercaptobenzimidazole.

Moreover, the microcapsules may contain a dye or pigment for the purpose of coloring the resulting light-sensitive layer and further a pH indicator as a printing-out agent and a dye as disclosed in J.P. KOKAI No. Sho 60-120354.

For the purpose of emulsification and dispersion in preparing microcapsules, a water soluble polymer and/or surfactant may be used. The water soluble polymers include anionic polymers, nonionic polymers and ampholeric polymers. The anionic polymer may be a natural or a synthetic one having, for instance, a group such as $—COO—$ and $—SO_3—$. As the natural anionic polymer, there may be mentioned, for example, gum arabic, alginic acid; as the semisynthetic anionic polymer, there may be mentioned, for example, carboxymethylcellulose, phthalated gelatin, sulfated starch, sulfated cellulose and lignin sulfonic acid. The synthetic anionic polymers include maleic anhydride type copolymers including those hydrolyzed, (meth)acrylic acid type polymers and copolymers, vinylbenzenesulfonic acid type polymers and copolymers, polyvinyl alcohol, and carboxy modified polyvinyl alcohols.

Examples of the amphoteric polymers include gelatin.

As the surfactant, there may be mentioned, for instance, nonionic surfactants such as polyoxyethylene alkyl ethers, polyoxyethylene alkyl phenyl ethers, polyoxyethylene fatty acid esters, sorbitan fatty acid esters, polyoxyethylene sorbitan fatty acid esters and glycerin fatty acid esters; anionic surfactants such as fatty acid salts, salts of alkylsulfates, alkylbenzenesulfonic acid salts, alkylnaphthalenesulfonic acid salts, dialkyl sulfosuccinates, salts of alkyl phosphates, condensates of naphthalene sulfonic acid and formalin, and salts of polyoxyethylene alkylsulfates; cationic surfactants such as alkylamine salts, quaternary ammonium salts and polyoxyethylene alkylamine salts; and fluorine atom-containing surfactants. These surfactants or dispersion stabilizers may be used alone or in combination.

To emulsify or disperse the aforementioned ingredients, an apparatus for emulsifying is in general used. Preferred examples of the apparatuses are those capable of imparting a great shearing force to a liquid to be treated or those capable of applying ultrasonic energy thereto and, in particular, include a colloid mill, a homogenizer, a capillary-tube type emulsifying apparatus, a liquid siren, an electromagnetic strain type ultrasonic wave generator and an emulsifier provided with a Pollman tube, which can provide an excellent result.

A microcapsule solution to be coated on a substrate may contain a filler such as talc powder, glass powder, clay, starch, wheat powder, corn powder, Teflon (trademark) powder and polyethylene powder to improve close-contact between an original plate and an original transparency. A protective layer such as a cover sheet of polyvinyl alcohol, a dry polymer coating and a mat layer may be applied to the light-sensitive element in order to control surface physical properties of the light-sensitive element.

Various kinds of additives, binders, antioxidants, dispersing agents, antifoaming agents, pigments, dyes, surfactants, which have been used in a recording system, coating techniques thereof and methods for use thereof are well known, which are disclosed in U.S. Pat. Nos. 2,711,375, 3,625,736, 3,836,383 and 3,846,331, British Patent No. 1,232,347 and J.P. KOKAI Nos. Sho 50-44012, Sho 50-50112, Sho 50-127718 and Sho 50-30615. These materials, techniques and methods can be used in the present invention.

The coating amount of the light-sensitive layer is preferably from 0.3 to 20 g/m², more preferably from 0.5 to 15 g/m², most preferably from 0.7 to 10 g/m².

The thus prepared light-sensitive element is exposed to actinic light. Light sources of actinic light include, for example, a mercury lamp, metal halide lamp, xenon lamp, chemical lamp, carbon-arc lamp and the like. Further, scanning exposure by high density energy beams, i.e. laser beams or electron beams can also be used in the present invention. Such laser beams include, for example, helium-neon laser beams, argon laser beams, krypton ion laser beams, helium-cadmium laser beams and the like.

The unexposed areas can be washed off with water after pattern exposure. The unexposed areas are preferably washed off with water by a brush, mop, sponge and the like. When the light-sensitive element is used in the form of a lithographic printing plate, it is preferred that the lithographic printing plate is set on an offset printing machine after pattern exposure to remove the light-sensitive layer in the unexposed areas directly on the printing machine by dampening roller and an inking roller and subjected to a printing process immediately thereafter.

Since the light-sensitive layer of the light-sensitive element of the present invention comprises microcapsules containing at least an ethylenically unsaturated compound and a photopolymerization initiator as active substances, wherein the active substances diffused from said microcapsules are present on and around said microcapsules, the light-sensitive layer is cured by exposure to light to form a continuous strong film. On the other hand, the unexposed areas can be easily washed off with water as the light-sensitive layer thereof comprises a large amount of the microcapsules. Further, when the light-sensitive element of the present invention is used in the form of a lithographic printing plate and the plate is mouted on an offset printing machine immediately after pattern exposure, the light-sensitive layer in the unexposed areas are easily removed with dampening water provided by a dampening roller, ink provided by an inking roller and friction force between these rolls and the surface of the plate to obtain prints having no background contamination.

The present invention will hereunder be explained in more detail with reference to the following non-limitative working Examples. Percentages of the Examples are by weight unless otherwise indicated.

EXAMPLE 1

(1) A substrate was prepared as follows.

The surface of an aluminum plate having the thickness of 0.24 mm was grained using a nylon brush and 400-mesh pumice-water suspension, and then well washed with water. The surface was then etched by immersing in 10% sodium hydroxide at 50° C. for 60 seconds, washed with flowing water, neutralized and washed with 20% $HNO_3$, and washed with water. Then, the plate was subjected to an electrolytic roughening treatment in 1% aqueous nitric acid solution, using alternating waveform current of sinusoidal wave, with an electricity quantity at an anodic state of 160 coulombs/$dm^2$, under the condition of a ratio of electricity quantity at a cathodic state to that at an anodic state being 0.8, and with a voltage at an anodic state of 12.7 V. The surface roughness of the resulting plate was measured to be $0.6\mu$ (expressed by Ra). The plate was subsequently immersed in 30% sulfuric acid and desmutted at 55° C. for 2 minutes. The plate was then anodized in 20% sulfuric acid with the current density of 2 A/$dm^2$ to make the thickness of anodized coating to be 2.7 g/$dm^2$. Finally, the plate was immersed in 2.5% aqueous sodium silicate solution at 70° C. for one minute, washed and then dried.

(2) A light-sensitive solution was prepared as follows.

| Preparation of Microcapsule Dispersion A | |
|---|---|
| [Oil Phase] | |
| Dipentaerythritol pentaacrylate (M400, available from TOAGOUSEI CHEMICAL Co., Ltd) | 25 g |
| [structure shown] | 2 g |
| Pergascript Blue SRB (available from CIBA-GEIGY Ltd) | 0.5 g |
| Dichloromethane | 5 g |
| Takenate D110N (available from Takeda Chemical Industries, Ltd) | 20 g |
| [Water Phase] | |
| 4% Polyvinyl alcohol (PVA205, available from KURARAY Co. Ltd) | 30 g |

The above oil phase was added to the above water phase and the resulting mixture was homogenized for 10 minutes at 8,000 rpm using a homogenizer to obtain an emulsion. Thirty grams of 3.5% aqueous solution of diethylene triamine was added to the emulsion while stirring the emulsion at 500 rpm at room temperature and subsequently stirred. After 30 minutes, the emulsion was heated to 60° C., subsequently stirred for additional 3 hours and then cooled to room temperature. The average particle size of the obtained microcapsules was $1.7\mu$.

| Preparation of Light-sensitive Solution B | |
|---|---|
| The above Microcapsule dispersion A | 10 g |
| Gum arabic | 0.15 g |
| Polyethylene glycol 600 diacrylate (A600, available from SHINNAKAMURA CHEMICAL INDUSTRY Co., Ltd) | 0.1 g |
| Propylene glycol monomethyl ether | 20 g |
| Megafack F171 (available from DAINIPPON INK & CHEMICALS, INC.) | 0.1 g |
| Water | 40 g |

Each component was successively added to water to prepare light-sensitive solution B.

(3) A presensitized plate was prepared as follows.

The above light-sensitive solution B was applied to the above treated aluminum substrate in the amount of 2.1 g/$m^2$ after drying. The coated substrate was dried at 60° C. in a thermostatic chamber to obtain presensitized plate C.

(4) The above prepared presensitized plate C was imagewise exposed to light and then set on Sakurai small-sized offset printing machine (ORIVER-52). A dampening roller was contacted with the surface of the printing plate and subsequently rotated for 20 cycles. Then an inking roller was contacted with the surface of the printing plate and papers were passed through the printing press to obtain prints having no background contamination.

EXAMPLE 2

(1) A light-sensitive solution was prepared as follows.

| Preparation of Light-sensitive Solution D | |
|---|---|
| Microcapsule dispersion A of Example 1 | 10 g |
| Gum arabic | 0.15 g |
| Polyethylene glycol 600 diacrylate (A600, available from SHINNAKAMURA CHEMICAL INDUSTRY Co., Ltd) | 0.1 g |
| Ethanol | 15 g |
| Megafack F171 (available from DAINIPPON INK & CHEMICALS, INC.) | 0.1 g |
| Water | 45 g |

(2) A presensitized plate was prepared as follows.

The above light-sensitive solution D was applied to an aluminum substrate treated in the same manner as that of Example 1 in the amount of 1.9 g/$m^2$ after drying. The coated substrate was dried at 60° C. in an air thermostatic chamber to obtain presensitized plate E.

(3) The above prepared presensitized plate E was imagewise exposed to light and then the surface of the printing plate was washed off with water by a sponge. Subsequently, the printing plate was set on Sakurai small-sized offset printing machine (ORIVER-52) and subjected to a printing process to obtain prints having no background contamination.

EXAMPLE 3

(1) A light-sensitive solution was prepared as follows.

| Preparation of Microcapsule Dispersion F | |
|---|---|
| [Oil Phase] | |
| Dipentaerythritol pentaacrylate (M400, available from TOAGOUSEI CHEMICAL Co., Ltd) | 20 g |
| [structure shown] | 2 g |
| Pergascript Blue SRB (available from CIBA-GEIGY Ltd) | 0.5 g |
| Dichloromethane | 5 g |
| Takenate D110N (available from Takeda Chemical Industries, Ltd) | 26 g |
| [Water Phase] | |

| Preparation of Microcapsule Dispersion F | |
|---|---|
| 3.8% Polyvinyl alcohol (PVA205, available from KURARAY Co. Ltd) | 25 g |

The above oil phase was added to the above water phase and the resulting mixture was homogenized for 10 minutes at 8,000 rpm using a homogenizer to obtain an emulsion. Forty grams of 4.5% aqueous solution of diethylene triamine was added to the emulsion while stirring the emulsion at 500 rpm at room temperature and subsequently stirred. After 30 minutes the emulsion was heated to 50° C., subsequently stirred for additional 3 hours and then cooled to room temperature. The average particle size of the obtained microcapsules was 1.8μ.

| Preparation of Light-sensitive Solution G | |
|---|---|
| Microcapsule dispersion F | 10 g |
| White dextrin (NICHIDEN CHEMICAL Co. Ltd) | 0.1 g |
| Polyethylene glycol 600 diacrylate (A600, available from SHINNAKAMURA CHEMICAL INDUSTRIES Co., Ltd) | 0.2 g |
| Propylene glycol monomethyl ether | 15 g |
| Megafack F171 (available from DAINIPPON INK & CHEMICALS, INC.) | 0.15 g |
| Water | 45 g |

Each component was successively added to water to prepare light-sensitive solution G.

(2) An imaging light-sensitive element was prepared as follows.

The above light-sensitive solution G was applied to a hydrophilized aluminum substrate in the amount of 2.1 g/m² after drying. The coated substrate was dried at 60° C. in an air thermostatic chamber to obtain imaging light-sensitive element H.

(3) The above prepared imaging light-sensitive element H was imagewise exposed to light and then washed off with water by a sponge to obtain blue images.

EXAMPLE 4

(1) A light-sensitive solution was prepared as follows.

| Preparation of Microcapsule Dispersion I | |
|---|---|
| [Oil Phase] | |
| Dipentaerythritol pentaacrylate (M400, available from TOAGOUSEI CHEMICAL Co., Ltd) | 10 g |

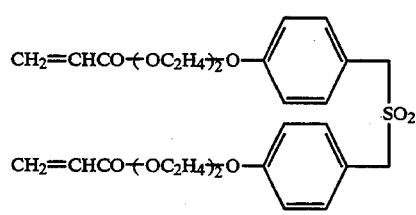

6 g (M205, available from TOAGOUSEI CHEMICAL Co., Ltd)

| Preparation of Microcapsule Dispersion I | |
|---|---|
| [structure: C₂H₅OCCH₂... Br... CCl₃ compound] | 2 g |
| Pergascript Blue SRB (available from CIBA-GEIGY Ltd) | 0.5 g |
| Dichloromethane | 5 g |
| Takenate D110N (available from Takeda Chemical Industries, Ltd) | 35 g |
| [Water Phase] | |
| 4.3% Polyvinyl alcohol (PVA205, available from KURARAY Co. Ltd) | 30 g |

The above oil phase was added to the above water phase and the resulting mixture was homogenized for 8 minutes at 7,000 rpm using a homogenizer to obtain an emulsion. Thirty grams of 5% aqueous solution of diethylene triamine was added to the emulsion while stirring the emulsion at 500 rpm at room temperature and subsequently stirred. After 30 minutes the emulsion was heated to 60° C., subsequently stirred for additional 2 hours and then cooled to room temperature. The average particle size of the obtained microcapsules was 1.6μ.

| Preparation of Light-sensitive Solution J | |
|---|---|
| Microcapsule dispersion I | 10 g |
| White dextrin (NICHIDEN CHEMICAL Co. Ltd) | 0.1 g |
| Gum arabic | 0.1 g |
| Polyethylene glycol 600 diacrylate (A600, available from SHINNAKAMURA CHEMICAL INDUSTRY Co., Ltd) | 0.1 g |
| Ethylene glycol monomethyl ether | 20 g |
| Megafack F171 (available from DAINIPPON INK & CHEMICALS, INC.) | 0.2 g |
| Water | 40 g |

Each component was succesively added to water to prepare light-sensitive solution J.

(2) A presensitized plate was prepared as follows.

The above light-sensitive solution J was applied to an aluminum substrate treated in the same manner as that of Example 1 in the amount of 1.8 g/m² after drying. The coated substrate was dried at 100° C. in an air thermostatic chamber to obtain presensitized plate K.

(3) The above prepared presensitized plate K was imagewise exposed to light and then set on a printing press (TOKO OFFSET 820). The surface of the plate was contacted with a dampening/inking roller and rotated for 20 cycles. Then papers were passed through the printing press to obtain prints having no background contamination.

EXAMPLE 5

(1) A light-sensitive solution was prepared as follows.

| Preparation of Microcapsule Dispersion L | |
|---|---|
| [Oil Phase] | |
| Dipentaerythritol pentaacrylate (M400, available from TOAGOUSEI CHEMICAL | 16 g |

| Preparation of Microcapsule Dispersion L | |
|---|---|
| Co., Ltd) | |

$$\underset{\substack{\text{C}_2\text{H}_5\text{OCCH}_2 \\ \| \\ \text{O}}}{\overset{\substack{\text{C}_2\text{H}_5\text{OCCH}_2 \\ \| \\ \text{O}}}{\text{N}}} \!\!-\!\! \underset{\text{Br}}{\bigcirc} \!\!-\!\! \underset{\substack{\text{N} \\ \| \\ \text{CCl}_3}}{\overset{\substack{\text{N} \\ \| \\ \text{CCl}_3}}{\text{N}}} \quad 2\text{ g}$$

| | |
|---|---|
| Pergascript Blue SRB | 0.5 g |
| (available from CHIBA GEIGY Ltd) | |
| Dichloromethane | 5 g |
| Takenate D110N | 30 g |
| (available from Takeda Chemical Industries, Ltd) | |
| [Water Phase] | |
| 6.6% Polyvinyl alcohol | 22.5 g |
| (PVA205, available from KURARAY Co. Ltd) | |

The above oil phase was added to the above water phase and the resulting mixture was homogenized for 10 minutes at 9,500 rpm using a homogenizer to obtain an emulsion. Thirty grams of 4% aqueous solution of diethylene triamine was added to the emulsion while stirring the emulsion at 500 rpm at room temperature and subsequently stirred. After 30 minutes the emulsion was heated to 60° C., subsequently stirred for additional 3 hours and then cooled to room temperature. The average particle size of the obtained microcapsules was 1.1μ.

| Preparation of Light-sensitive Solution M | |
|---|---|
| Microcapsule dispersion L | 10 g |
| Gum arabic | 0.15 g |
| Polyethylene glycol 600 diacrylate | 0.1 g |
| (A600, available from SHINNAKAMURA CHEMICAL INDUSTRY Co., Ltd) | |
| Propylene glycol monomethyl ether | 20 g |
| Megafack F171 | 0.1 g |
| (available from DAINIPPON INK & CHEMICALS, INC) | |
| Water | 40 g |

Each component was successively added to water to prepare light-sensitive solution M.

(2) A presensitized plate was prepared as follows.

The above light-sensitive solution M was applied to an aluminum substrate treated in the same manner as that of Example 1 in the amount of 2 g/m² after drying. The coated substrate was dried at 60° C. in an air thermostatic chamber to obtain presensitized plate N.

(3) The above prepared presensitized plate N was imagewise exposed to light and then set on SAKURAI small-sized printing press (ORIVER-52). The surface of the plate was contacted with a dampening roller, rotated for 20 cycles and then contacted with an inking roller. Papers were passed through the printing press to obtain prints having no background contamination.

COMPARATIVE EXAMPLE

A comparative sample was prepared as follows.

| (1) Preparation of Liqht-sensitive Solution O | |
|---|---|
| Microcapsule dispersion M of Example 5 | 10 g |
| Gum arabic | 0.15 g |
| Polyethylene glycol 600 diacrylate | 0.1 g |
| (A600, available from SHINNAKAMURA CHEMICAL INDUSTRY Co., Ltd) | |
| Megafack F171 | 0.1 g |
| (available from DAINIPPON INK & CHEMICALS, INC) | |
| Water | 60 g |

(2) A presensitized plate was prepared as follows.

The above light-sensitive solution O was applied to an aluminum substrate treated in the same manner as that of Example 1 in the amount of 2 g/m² after drying. The coated substrate was dried at 100° C. in an air thermostatic chamber to obtain presensitized plate P.

(3) The above prepared presensitized plate P was imagewise exposed to light and then set on Sakurai small-sized printing press (ORIVER-52). The surface of the plate was contacted with a dampening roller, rotated for 20 cycles and then contacted with an inking roller. Papers were passed through the printing press. The images on the papers began to disappear immediately after printing started.

What is claimed is:

1. A process for preparing a light-sensitive element which comprises the steps of providing a dispersion of microcapsules containing at least an ethylenically unsaturated compound and a photopolymerization initiator, adding to said dispersion a solvent which swells the wall of said microcapsules and dissolves said ethylenically unsaturated compound and said photopolymerization initiator to prepare a light-sensitive solution wherein the ethylenically unsaturated compound and the photopolymerization initiator diffuse from the microcapsules to be present on and around the surface of the microcapsules, coating the light-sensitive solution on a substrate and drying the coated substrate.

2. The process according to claim 1, wherein the solvent is selected from the group consisting of alcohols, ethers, acetals, esters, ketones, polyalcohols, amides, amines, fatty acids and a mixture thereof.

3. The process according to claim 1, wherein the amount of the solvent is from 5 to 95% by weight based on the total weight of the light-sensitive solution.

* * * * *